United States Patent [19]

Geissler et al.

[11] Patent Number: 4,495,271
[45] Date of Patent: Jan. 22, 1985

[54] RADIATION POLYMERIZABLE MIXTURE AND COPYING MATERIAL PRODUCED THEREFROM

[75] Inventors: Ulrich Geissler, Frankfurt am Main; Walter Herwig, Bad Soden; Elisabeth Fetsch, Wiesbaden, all of Fed. Rep. of Germany

[73] Assignee: Hoechst Aktiengesellschaft, Frankfurt am Main, Fed. Rep. of Germany

[21] Appl. No.: 379,865

[22] Filed: May 19, 1982

[30] Foreign Application Priority Data

May 20, 1981 [DE] Fed. Rep. of Germany ....... 3120052

[51] Int. Cl.$^3$ ............................ G03C 1/94; G03C 1/70
[52] U.S. Cl. ..................................... 430/277; 430/275; 430/278; 430/279; 430/271; 430/284; 430/285; 430/288; 430/910; 430/916; 204/159.16
[58] Field of Search ............... 430/286, 284, 285, 272, 430/275, 271, 276, 277, 278, 279, 905, 910, 911, 430/913, 916, 288; 204/159.15, 159.16, 159.22

[56] References Cited

U.S. PATENT DOCUMENTS

| | | | |
|---|---|---|---|
| 3,804,631 | 4/1974 | Faust et al. | 430/281 |
| 3,930,865 | 1/1976 | Faust et al. | 430/281 |
| 4,038,084 | 7/1977 | Nakano et al. | 96/115 P |
| 4,137,081 | 1/1979 | Pohl | 430/286 X |
| 4,177,074 | 12/1979 | Proskow | 430/288 X |
| 4,198,238 | 4/1980 | Scheve | 430/286 |
| 4,227,980 | 10/1980 | Pregitzer et al. | 204/159.15 X |
| 4,229,517 | 10/1980 | Bratt et al. | 430/271 |
| 4,245,030 | 1/1981 | Faust et al. | 430/284 X |
| 4,272,607 | 6/1981 | Tsukada et al. | 430/288 |
| 4,312,916 | 1/1982 | Kakumaru et al. | 204/159.16 X |
| 4,370,403 | 1/1983 | Takaki | 430/281 X |

FOREIGN PATENT DOCUMENTS

| | | |
|---|---|---|
| 0035574 | 9/1981 | European Pat. Off. |
| 1377512 | 12/1974 | United Kingdom . |
| 1379228 | 1/1975 | United Kingdom . |
| 2059982 | 4/1981 | United Kingdom . |

*Primary Examiner*—John E. Kittle
*Assistant Examiner*—Cynthia Hamilton
*Attorney, Agent, or Firm*—Schwartz, Jeffery, Schwaab, Mack, Blumenthal & Koch

[57] ABSTRACT

A radiation-polymerizable mixture comprising a binder which is insoluble in water, but soluble or at least swellable in aqueous alkaline solutions; a radiation-activatable polymerization initiator; and a polymerizable polypropylene glycol diester with acrylic or methacrylic acid corresponding to the formula:

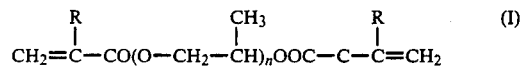

wherein R represents a hydrogen atom or a methyl group and n represents a number from 2 to 13; and a light-sensitive copying material comprising a support and a light-sensitive layer comprising a mixture of the foregoing type. The radiation-polymerizable mixture of the invention produces non-tacky layers which exhibit a low sensitivity to atmospheric oxygen and are useful as dry or liquid photoresists.

20 Claims, No Drawings

RADIATION POLYMERIZABLE MIXTURE AND COPYING MATERIAL PRODUCED THEREFROM

BACKGROUND OF THE INVENTION

The present invention relates to a mixture which can be polymerized by radiation, particularly by light, and which contains as the essential constituents, a binder which is insoluble in water but soluble or swellable in aqueous alkaline solutions, a photoinitiator and a polyglycol dimethacrylate or diacrylate.

The mixture of the invention is particularly suitable as a photoresist for production of printed circuits, electroplating resists and etched microstructures. Further fields of application include production of etched gravure printing forms and relief printing forms.

Negative-acting photoresist lacquers which are applied in the form of a solution to the supports to be treated, are based essentially on the following types of compounds: polyvinyl cinnamates (U.S. Pat. No. 2,690,966 and U.S. Pat. No. 2,732,301), polyvinyl cinnamylidene esters (U.S. Pat. No. 3,549,368), polystyrene cinnamyl ketone (U.S. Pat. No. 2,566,302) and other polymers containing cinnamoyl groups (German Pat. Nos. 1,063,802 and 1,067,219 and German Offenlegungsschrift No. 2,111,415), allyl ester prepolymers (U.S. Pat. Nos. 3,376,138; 3,376,139 and 3,462,267) and polyisoprenes (U.S. Pat. No. 2,852,379 and British Pat. No. 892,811).

Although some of these substances are used industrially as photoresist solutions, most of them have certain disadvantages. They require organic solvents for development, or they have a relatively low sensitivity to light. Others have a poor adhesion to metal surfaces, or can only be processed to give relatively small layer thickness.

Negative-acting liquid photoresist compositions which depend on crosslinking by photoinitiated free-radical polymerization and which can be developed in aqueous alkaline solutions, are described, for example, in British Pat. No. 1,377,512. However, the mixtures described in that document are sensitive to oxygen. For this reason, the layers must be provided with a polyvinyl alcohol covering layer.

A further considerable problem is tackiness of photopolymerizable layers, which can make contact exposure impossible. Thus the layers described in British Pat. No. 1,379,228 exhibit a tendency toward adhesion or imprinting if they are exposed in direct contact with an original.

British Pat. No. 2,059,982 describes photopolymerizable mixtures which can advantageously be used as pre-formed, transferable photoresist layers applied to a plastic film as a temporary support. These layers are transferred to the final support by lamination under heat and pressure. For this purpose, they contain polymerizable compounds of a fairly high molecular weight, namely diacrylates or dimethacrylates of polyglycols, especially polyethylene glycols having 14 to 23 glycol units, in order to prevent evaporation of the monomer at the laminating temperature.

The use of this type of mixture as a photoresist solution, which is applied as such by the user directly to the support to be treated and is dried, has not heretofore gained acceptance in the art because it is too difficult for the user to apply the protective covering layers or films to the photoresist layer.

SUMMARY OF THE INVENTION

Accordingly, it is the object of the present invention to provide an improved photopolymerizable mixture.

Another object of the present invention is to provide a photopolymerizable mixture useful in negative-acting photoresists.

Yet another object of the present invention is to provide a photosensitive material which does not require organic solvents for development.

An additional object of the present invention is to provide a photosensitive material which can be developed in aqueous alkaline solutions.

A further object of the invention is to provide a photopolymerizable mixture which exhibits a high sensitivity to light.

Still another object of the present invention is to provide a photopolymerizable mixture which exhibits good adhesion to metal surfaces.

A further object of the present invention is to provide a photopolymerizable mixture which can be processed to produce photosensitive layers of substantial thickness.

Additionally, it is an object of the present invention to provide a photopolymerizable mixture which exhibits a low sensitivity to oxygen.

Another object of the invention is to provide a photosensitive material which does not require use of a protective cover film.

Yet another object of the present invention is to provide a photopolymerizable mixture which is non-tacky.

Still another object of the invention is to provide a photosensitive material which is suitable for contact exposure.

An additional object of the present invention is to provide a photopolymerizable mixture which is useful in dry or liquid photoresists.

It is also an object of the present invention to provide an improved copying material comprising a radiation polymerizable layer meeting the foregoing objects.

These and other objects of the invention are achieved by providing a radiation polymerizable mixture comprising a binder which is insoluble in water, but soluble or at least swellable in aqueous alkaline solutions; a radiation-activatable polymerization initiator; and a polyglycol diacrylate or dimethacrylate corresponding to the formula:

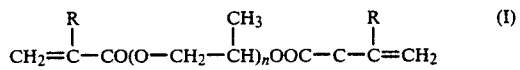

wherein R represents a hydrogen atom or a methyl group and n represents a number from 2 to 13.

In a further aspect of the invention, the objects are achieved by providing a copying material comprising a support and a polymerizable layer comprising a binder which is insoluble in water, but soluble or at least swellable in aqueous alkaline solutions; a radiation-activatable polymerization initiator; and a polyglycol diacrylate or dimethacrylate corresponding to the formula:

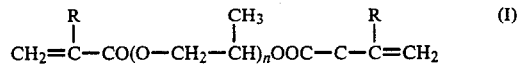

wherein R represents a hydrogen atom or a methyl group and n represents a number from 2 to 13.

In particularly preferred aspects of the invention, the polyglycol diester is a dimethacrylate ester; the polyglycol moiety comprises from 4 to 10 oxyalkylene groups; the polyglycol diester comprises from 10 to 100 weight percent of the total quantity of polymerizable compounds in the polymerizable mixture or layer, and the polymerizable mixture or layer further comprises at least one polymerizable compound selected from the group consisting of acrylic or methacrylic acid esters of polyols containing from two to four hydroxyl groups.

DETAILED DESCRIPTION OF PREFERRED EMBODIMENTS

The invention relates to a mixture which can be polymerized by radiation and which contains, as the essential constituents:

(a) a binder which is insoluble in water but is soluble or at least swellable in aqueous alkaline solutions, (b) a polymerization initiator which can be activated by radiation, and (c) a polyglycol dimethacrylate or diacrylate.

In the radiation-polymerizable mixture of the invention, the polyglycol dimethacrylate or diacrylate is a compound corresponding to the formula:

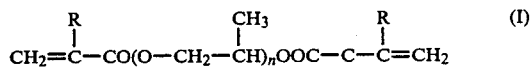

wherein R represents a hydrogen atom or a methyl group and n represents a number from 2 to 13, preferably from 4 to 10.

Suitable electromagnetic radiation, to which the radiation-polymerizable mixture of the invention is sensitive, includes any radiation having an energy corresponding at least to that of short-wave visible light. Light having a wavelength within the range from 300 to 500 nm is preferred, but X-ray radiation, electron radiation, other corpuscular radiation and laser radiation are also suitable for initiating the polymerization. In every case the initiator system can be adjusted to, or sensitized for, the desired radiation in a known manner.

Amongst the compounds corresponding to the formula I, the compounds which are particularly preferred are those in which R represents a methyl group. These compounds are known per se and are commercially available.

In addition to the polymerizable compound corresponding to the formula I, the radiation-polymerizable mixture of the invention may also contain up to 90 weight percent, relative to its total content of polymerizable compounds, of other acrylates or methacrylates of dihydric to tetrahydric alcohols. It is particularly advantageous to add acrylates, and especially methacrylates, of polyhydric alcohols, particularly dihydric alcohols, containing urethane groups in the molecule. Urethane compounds which are particularly preferred include compounds corresponding to the general formula:

wherein X represents a hydrocarbon radical, preferably a saturated aliphatic or cycloaliphatic radical, having 2 to 20 carbon atoms, Y represents one of the groups:

$(-C_pH_{2p}-S)_{m-1}-C_pH_{2p}-O-$;

$(-C_pH_{2p}-O)_m-$;

$-C_rH_{2r-2}-O-$;

$-C_sH_{2s}-Z(-CO-C_qH_{2q}-O)_m-$;

$(-C_qH_{2q}-O-CO-Q-COO)_m-C_qH_{2q}-O-$;

and

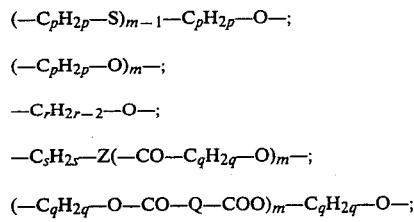

R and R' individually represent hydrogen atoms or methyl groups, R" represents O, S, $CR_2$, or $SO_2$; Q represents a phenyl group or one of the groups $C_qH_{2q}$ and $C_9H_{2q-2}$; Z represents O or NR, n represents a number from 0 to 20; m represents a number from 1 to 40, p represents a number from 2 to 20; q represents a number from 2 to 10; r represents a number from 4 to 20, and s represents a number from 2 to 10.

Preferred compounds corresponding to formula II are those in which n is a number from 0 to 20, particularly from 0 to 10. R and R' are preferably methyl groups.

Preferred diol components useful for preparing the polymerizable urethanes comprise polyether diols, particularly saturated polyether diols. Y is thus preferably the group $(-C_pH_{2p}-O)_m-$ in which preferred values of p are 2 to 10, particularly 2 to 4. If unsaturated diols are used, they preferably comprise from 4 to 10 carbon atoms per diol unit.

For certain purposes, such as achievment of specific mechanical properties or higher sensitivity to light, it may also be advantageous to use polyester diols. These can be synthesized in a known manner from dicarboxylic acid and diol units or from hydroxycarboxylic acid units. Preferred hydroxycarboxylic acids in this regard are those in which q is 3 to 6.

The polyester diols produced from hydroxycarboxylic acids are usually prepared from lactones by ring opening by means of a molecule of an active hydrogen compound $HO-C_sH_{2s}-Z-H$. In this formula, s preferably has a value of 2 to 6, and Z is preferably an oxygen atom. In general, polyester diols having molecular weights within the range from about 500 to about 3,000 are very suitable.

The preparation of the polymerizable diurethanes or polyurethanes is effected in a manner which is known per se, for example as described in U.S. Pat. No. 3,297,745; or German Offenlegungsschrift No. 2,064,079; or German Offenlegungsschrift No. 2,822,190.

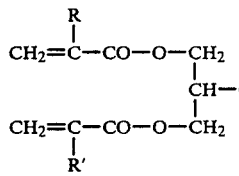 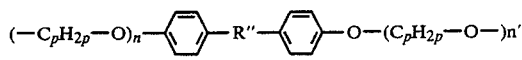 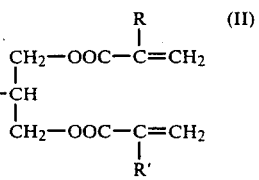

For the preparation of the glycerol diester, 1 mole of glycidyl acrylate or glycidyl methacrylate is reacted with 1 mole of acrylic acid or methacrylic acid. Two moles of this reaction product are then reacted with 1 mole of a diisocyanate. The diisocyanate used is either a monomer or is a product from the reaction of an excess of a monomeric diisocyanate with a diol component. In the latter case, the diol component HO—Y—H is previously reacted with the desired excess of diisocyanate. As a rule, homologouspolymer mixtures are obtained in this reaction. The non-uniformity of the molecular weights of the diisocyanates obtained therefrom results in products which have a high viscosity and are virtually non-crystallizable.

The compounds corresponding to formula II and their preparation and use are described in detail in U.S. Ser. No. 330,888 filed Dec. 15, 1981, the entire disclosure of which is incorporated herein by reference.

The total quantity of polymerizable compounds in the radiation-polymerizable mixture of the invention is generally from about 20 to about 80, preferably from about 30 to about 70 weight percent of the non-volatile constituents of the mixture.

A large number of substances are suitable as photoinitiators such as benzoin; benzoin ethers; polynuclear quinones, for example 2-ethylanthraquinone; acridine derivatives, for example 9-phenylacridine, 9-p-methoxyphenylacridine, 9-acetylaminoacridine or benz(a)-acridine; phenazine derivatives, for example 9,10-dimethylbenz(a)phenazine, 9-methylbenz(a)phenazine or 10-methoxybenz(a)phenazine; quinoxaline derivatives, for example 6,4',4''-trimethoxy-2,3-diphenylquinoxaline or 4',4''-dimethoxy-2,3-diphenyl-5-azaquinoxaline; and quinazoline derivatives. The photoinitiators are generally added in an amount of from about 0.1 to about 20 weight percent relative to the non-volatile constituents of the photopolymerizable mixture.

Natural or synthetic polymers which are insoluble in water and are soluble or at least swellable in aqueous alkaline solutions are used as binders, since layers containing such binders can be developed using the preferred aqueous alkaline developers. Binders of this type can, for example, contain the following groups: —COOH, —PO$_3$H$_2$, —SO$_3$H, —SO$_2$NH$_2$, —SO$_2$—NH—CO— and the like. Examples of suitable binders include maleate resins, polymers formed from beta-methacryloyloxethyl N-(p-tolylsulfonyl)-carbamate and copolymers of these and similar monomers with other monomers, styrene/maleic anhydride copolymers, methyl methacrylate/methacrylic acid copolymers and copolymers formed from methacrylic acid, alkyl methacrylates and methyl methacrylate and/or styrene, acrylonitrile and terpolymers of methacrylic acid, methyl methacrylate or an alkyl methacrylate having 4 to 15 carbons in the alkyl group, and styrene or acrylonitrile.

The quantity of the binder generally comprises from about 20 to about 80, preferably from about 30 to about 70, weight percent of the constituents of the mixture.

In addition to monomers, binders and photoinitiators, the photopolymerizable mixture of the invention may optionally contain stabilizers and/or inhibitors for preventing polymerization of the monomers in the dark, hydrogen donors, compounds for decreasing sensitivity to oxygen, wetting agents, plasticizers, sensitometric regulators, dyes and colorless or colored pigments.

The hydrogen donors used are principally aliphatic polyethers. In appropriate circumstances, this function may also be performed by the binder or by the polymerizable monomer, if they contain labile hydrogen atoms.

The compounds added to decrease sensitivity to oxygen may advantageously be disulfides as described in German Offenlegungsschrift No. 2,944,866.

The preparation of light-sensitive materials using the radiation-polymerizable mixture of the invention is carried out in a known manner. The mixture is taken up in a solvent, and the solution or dispersion is applied in the form of a film to the intended support by casting, spraying, dipping or roller application and subsequently dried. Generally, the photosensitive layer will have a thickness lying in the range from 0.5 to 150 µm.

The nature of the support for the radiation-polymerizable layer depends on the end use of the light-sensitive material. Besides copper, steel, chromium-plated copper or steel, zinc, nickel, aluminum or aluminum alloys, it is also possible to use layers of silicon dioxide, or doped oxide layers, which have been grown or deposited by heat, synthetic polymer films such as films of polyethylene terephthalate or cellulose acetate, or screen printing supports such as nylon (Perlon) gauze or nickel screens.

The mixture according to the invention produces photopolymerizable layers which have a high sensitivity to light. The layers exhibit no tendency toward adhesion or imprinting even at layer thicknesses of up to 150 µm. They can be developed with aqueous alkaline solutions and exhibit an excellent resistance to developer. The ratio of the layer thickness of the photopolymerizable layer to the degree of resolution is 1:1 to 1:2. The shoulders of the exposed portions of the layer, and thus also the metal buildup, are virtually straight and vertical at layer thicknesses of up to 110 µm.

The formation of an image on copying materials, produced with the radiation-polymerizable mixtures of the invention, is effected in a known manner, for example by contact exposure under or through a transparent original. Customary light sources such as carbon arc lamps, xenon lamps, high-pressure mercury vapor lamps doped with metal halides, and the like are used in this process. An image may also be formed on the copying material by means of laser light, for example using an argon ion laser.

After exposure, the copying materials are developed in a known manner by washing away the unexposed areas of the layer by means of a developer. Suitable developers are aqueous solutions which can contain buffer salts, for example ammonium phosphates, silicates, hydroxides, or carbonates or alkali metal phosphates, silicates, hydroxides or carbonates; wetting agents, dyes, optional water-miscible organic solvents, and other customary additives, and also aqueous solutions of wetting agents.

The radiation-polymerizable mixtures of the invention are suitable for production of dry resist films, relief images, screen printing stencils and color proofing films. They can also be used as fast-curing coating compositions, dental filling compositions, adhesives and for the preparation of rigid, heat-stable moldings.

The mixtures of the invention are useful with particular advantage in dissolved form for producing etch resist layers or electroplating resist layers on metallic supports. Above all, they are suitable for use on copper supports, as used for example, for producing printed circuits and gravure printing forms. They can also be employed advantageously as prefabricated dry resist films for the same uses.

In such applications, the excellent adhesion of the exposed portions of the layers proves adequate not only during development, but also during subsequent etching and reinforcement of the support by electroplating, in the course of which the layers exhibit good resistance.

When the preferred urethane monomers corresponding to formula II are used as additives, the radiation-polymerizable mixture of the invention is distinguished by a particularly low sensitivity towards oxygen, which is still pronounced even in the case of thin layers. After the solution has dried, the layers are not tacky and, even during vacuum contact, do not become imprinted by the original. It is surprising that this property is only achieved by the above-described polypropylene glycol esters corresponding to formula I. If these monomers are replaced by the same or an equivalent quantity of polyethylene glycol bisacrylate or bismethacrylate, a tacky layer is obtained.

The mixture can be applied in layer thicknesses of about 0.5 to 150 μm. Even in this thickness, it exhibits a high sensitivity to light and can, in spite of this, be developed rapidly with alkaline solutions, while having a good resistance to developer. It can therefore be employed for the production of electroplating resists. The shoulders of the exposed portions of the layers and thus also the buildup of metal are virtually straight and vertical at layer thicknesses up to 110 μm. In some cases it can be advantageous to render the layer even more resistant by heating prior to etching.

The following non-limiting examples illustrate embodiments of the radiation-polymerizable mixture of the invention and the use thereof for preparing photopolymerizable copying materials. Unless otherwise indicated, parts, percentages and ratios are expressed in terms of weight units.

EXAMPLE 1

A solution of:
66 parts of a terpolymer formed from n-hexyl methacrylate, methacrylic acid and styrene 60:30:10, having an average molecular weight of approximately 35,000 and an acid number of about 200;
42 parts polypropylene glycol 420 dimethacrylate;
1.3 parts 9-phenylacridine, and
0.2 parts of a blue dyestuff obtained by coupling a 2,4-dinitro-6-chlorobenzenediazonium salt with 2-methoxy-5-acetylamino-N-cyanoethyl-N-hydroxyethylaniline, in
240 parts butanone, and
30 parts ethanol was spin-coated onto a phenoplast laminate sheet, laminated to a 35 μm thick copper foil so that, after drying at 100° C., a layer 80 μm thick was obtained. The sheet was exposed for 6 seconds using a 5 kW metal halide lamp, at a distance of 110 cm between the lamp and the vacuum copying frame. A 13-step exposure wedge having density increments of 0.15, as well as a line original having line widths and spacings down to 80 μm. was used as the original.

After exposure, the layer was developed for 100 seconds with 0.8% sodium carbonate solution in a spray developing apparatus. Five to six fully crosslinked wedge steps were obtained.

The sheet was then rinsed for 30 seconds with tap water, etched for 30 seconds in a 15% ammonium peroxydisulfate solution, rinsed again with water, immersed for 30 seconds in 10% sulfuric acid and then electroplated successively in the following electrolyte baths:

(1) 50 minutes in a "Glanzkuper-Bad (Bright copper bath) PC" type electrolyte bath made by Schloetter, Geislingen/Steige;
current density: 2.5 amperes/dm$^2$
metal buildup: approximately 25 μm
temperature: room temperature
(2) 55 minutes in a LA lead-tin bath made by Schloetter, Geislingen/Steige;
current density: 2 amperes/dm$^2$
metal buildup: 55 μm
temperature: room temperature The plated sheet showed no undercutting or incursions under the resist layer or damage.

The overhang, or the inclination of a shoulder of the resist layer, was 7 μm at a resist web width of 138 μm, that is to say the upper edge of the resist shoulder projected 7 μm over the lower edge.

It was then possible to remove the coating from the sheet in a 5% KOH solution at 50° C., and the exposed copper could then be removed by etching in the customary etching media.

If the monomer is replaced by polyethylene glycol 400 dimethacrylate, by trimethylolethane triacrylate or by a reaction product of 1 mole of 2,2,4-trimethyl-hexamethylene diisocyanate and 2 moles of hydroxyethylmethacrylate, layers are obtained, from which, after exposure, the film original can only be separated with damage to the resist layer resulting from tearing out of portions of the layer.

EXAMPLE 2

A copper-laminated sheet of insulating material was coated, dried, exposed and developed as in Example 1. The sheet was then electroplated as follows:

(1) 100 minutes in the copper electrolyte bath described in Example 1;
current density: 2.5 amperes/dm$^2$
metal buildup: approximately 50 μm
temperature: room temperature
(2) 10 minutes in a "Norma" type nickel bath made by Schloetter, Geislingen/Steige;
current density: 4 amperes/dm$^2$
metal buildup: approximately 10 μm
temperature: 50° C.
(3) 12 minutes in an "Autronex CC" type gold bath made by Blasberg, Solingen;
current density: 1 ampere/dm$^2$
metal buildup: approximately 5 μm
temperature: 40° C.

This sheet also exhibited no undercutting or damage.

EXAMPLE 3

The resist solution described in Example 1 was spin-coated onto a phenoplast laminate sheet, laminated to a copper foil 35 μm thick, and was dried (layer thickness 108 μm). The sheet was exposed as described in Example 1 for 8 seconds and then was developed for 140 seconds with 0.8% sodium carbonate solution. Six fully cross-linked wedge steps were obtained.

After being pretreated as described in Example 1, the sheet was electroplated as follows:

180 minutes in the nickel bath described in Example 2;
current density: 4 amperes/dm$^2$
metal buildup: 180 μm
temperature: 50° C.

This sheet also exhibited no undercutting or damage. It was possible to remove its coating with KOH solution and to etch it with customary etching agents.

The resist shoulder was found to have an overhang of 13 μm on one side. The resist web width was 138 μm.

EXAMPLE 4

One hundred ml of the photoresist solution from Example 1 were diluted with 25 ml of butanone and 25 ml of ethylene glycol monethyl ether. Using a Mettenheimer cylindrical spraying apparatus, a resist layer was applied to a brass sheet 0.2 mm thick which had been previously nickel-plated to a thickness of 10 μm. Immediately after application, the resist layer was dried for 10 minutes using an infrared lamp (1,200 watts) at a distance of 20 cm from the layer. The layer thickness was 70 μm. It was exposed for 50 seconds with a 400 watt lamp and was then developed with 0.8% sodium carbonate solution. The development time was 80 seconds. The layer had a resistance time of 7 minutes. The resolution was about 65 μm.

The test sheet was passivated for 3 minutes in a 2% potassium dichromate solution and, after being rinsed with water (30 seconds), was nickel-plated for 2 hours or for 3 hours at 3 amperes/dm$^2$. This deposited 70 μm or 110 μm, respectively, of nickel.

The nickel electroplating mask was removed, and the resist stencil was then dissolved off with acetone.

EXAMPLE 5

A solution having the following composition was spin-coated onto a phenoplast laminate support laminated to a copper foil 17 μm thick, such that, after drying, a 5 μm thick layer was obtained:

6.5 parts of the copolymer described in Example 1,
3.4 parts polypropylene glycol 420 dimethacrylate,
0.3 part 9-phenylacridine,
0.075 part of the blue dyestuff from Example 1, and
0.025 part crystal violet in
26 parts butanone, and
20 parts ethanol.

The sheet was exposed for 20 seconds with a 5 kW metal halide lamp. The original used was a gravure screen (cell wall width 36 μm) as well as an Itek test original (elements of 2 to 500 μm). The sheet was developed for 35 seconds with 0.8% sodium carbonate solution.

After developing, the resolution was about 10 μm and width of the cell walls of the gravure screen was 48 μm. After etching for 65 seconds with iron (III) chloride solution at 40° C., the resulting screen cell wall widths measured 12 μm at the upper edge and 33 μm at the lower edge.

EXAMPLES 6–13

Solutions were prepared as in Example 5, which, in place of the quantity of polypropylene glycol 420 dimethacrylate (PPG-420-DMA) used in that example, contained mixtures of this dimethacrylate with other difunctional and/or polyfunctional methacrylates or acrylates. Results are shown in the following table.

EXAMPLE 14

A solution of:
6.5 parts of the terpolymer described in Example 1,
1.6 parts polyethylene glycol 400 dimethacrylate,
1.6 parts of polypropylene glycol 420 dimethacrylate,
0.1 part 9-phenylacridine,
0.01 part of the azo dye from Example 1,
0.0045 part of the azo dye 5-nitro-2-[2-methyl-4-(N-ethyl-N-cyanoethyl) -aminobenzeneazo-benzothiazole],
and
0.8 part of the elastomer described below in
38 parts butanone
were spin-coated onto a biaxially stretched and heatset polyethylene terephthalate film 25 μm thick such that, after drying at 100° C., a layer weighing 40 g/m$^2$ was obtained.

| Example No. | PPG-420-DMA (parts by wt.) | Added Monomer (parts by wt.) | Tackiness[1] | Optimum exposure time (seconds) | Resolution (μm) at a layer thickness of 5 μm |
|---|---|---|---|---|---|
| 6 | 2.55 | Dipropylene glycol dimethacrylate (0.85) | ++ | 25 | 12 |
| 7 | 2.55 | Polypropylene glycol 420 diacrylate (0.85) | + | 20 | 10 |
| 8 | 2.55 | Diurethane obtained from 2 moles of glycerol dimethacrylate and 1 mole of hexamethylene diisocyanate (0.85) | ++ | 15 | 10 |
| 9 | 1.7 | Above diurethane (1.7) | ++ | 15 | 12 |
| 10 | 2.55 | Oligourethane obtained from 2 moles of glycerol dimethacrylate, 2 moles of hexamethylene diisocyanate and 1 mole of polyethylene glycol 400 (0.85) | ++ | 15 | 10 |
| 11 | 1.7 | Above oligourethane (1.7) | ++ | 15 | 10 |
| 12 | 2.55 | Polyethylene glycol 400 dimethacrylate (PEG-400-DMA) (0.85) | ++ | 25 | 10 |
| 13 | 1.7 | PEG-400-DMA (1.7) | + · | 13 | 10 |

[1] ++ layer completely dry and tack-free;
+ slight imprints

The resulting dry resist film was laminated at 120° C., using a commercially available laminating apparatus, onto a preheated phenoplast laminated sheet, laminated to a copper foil 35 μm thick, and was exposed for 4 seconds with a commercially available exposure apparatus. The original used was a line original having line widths and spacings ranging down to 80 μm.

After exposure, the polyester film was removed, and the layer was developed for 90 seconds with 0.8% sodium carbonate solution in a spray developing apparatus.

The sheet was then subjected to further processing and electroplated, as described in Example 1, except it was treated for 20 minutes at 1 ampere/dm$^2$ in the lead/tin bath, and the resulting metal buildup amounted to 10 μm.

The sheet exhibited no undercutting or damage at all. The color of the resist was unchanged. It was then possible to remove the coating from the sheet in 5% KOH solution at 50° C. and to remove the exposed copper by etching in the customary etching media.

After the lead/tin electroplating, especially in baths having a high content (300 g/l) of fluoboric acid, a resist layer containing 3.2 parts by weight of polyethylene glycol 400 dimethacrylate instead of the mixture of monomers described above exhibited a pronounced golden discoloration, associated with a certain degree of embrittlement.

The elastomer used was prepared as follows:

A. 426 parts by weight of glycidyl methacrylate and 216 parts by weight of adipic acid were mixed by stirring in a 1 liter four-necked flask, equipped with a stirrer, a thermometer, a reflux condenser and a drying tube. After addition of 19.7 parts by weight of p-methoxyphenol and 6.4 parts by weight of benzyltriethylammonium chloride, the mixture was heated cautiously to an internal temperature of 80° C. A clear solution was obtained after approximately 2 hours; which was kept at 80° C. for a further 14 hours. After this time the content of free glycidyl methacrylate was less than 0.5%.

B. 143 parts by weight of an oligomeric diisocyanate prepared by reacting tolylene diisocyanate with poly-1,4-butanediol, having an average molecular weight of about 2,000 and containing 4.1% by weight of isocyanate groups (Adiprene L 100), dissolved in 300 parts by volume of methyl ethyl ketone, was placed in a 1 liter four-necked flask equipped with a stirrer, a thermometer, a dropping funnel, a condenser and a drying tube, and mixed with 0.87 part by weight of benzoquinone and 0.85 part by volume of a solution obtained by dissolving 6.3 parts by weight of iron (III) acetylacetonate and 0.45 part by weight of triethylamine in methyl ethyl ketone and making up the mixture to 100 parts by volume with methyl ethyl ketone. A solution of 31.33 parts by weight of the reaction product obtained in accordance with A. in 300 parts by volume of methyl ethyl ketone was charged into the dropping funnel and was added dropwise over the course of 40 minutes to the solution in the flask, which was heated at 70° C. and stirred. After stirring for a further two hours at 30° C., 10 parts by volume of ethanol were added to the clear reaction mixture. Distilling off the solvent from the viscous solution gave a non-tacky, rubber-like mass which dissolved to give a clear solution in numerous organic solvents, such as tetrahydrofuran, acetone or toluene. The reduced specific viscosity of the product was 0.72 dl/g (measured with a 1% solution in dimethylformamide at 25° C.).

The foregoing description has been set forth merely to illustrate the invention and is not intended to be limiting. Since modifications of the disclosed embodiments incorporating the spirit and substance of the invention may occur to persons skilled in the art, the scope of the invention should be limited solely with respect to the appended claims and equivalents.

We claim:

1. A radiation-polymerizable mixture consisting essentially of
   (a) from about 20 to about 80 weight percent of a binder which is insoluble in water, but soluble or at least swellable in aqueous alkaline solutions, and which consists essentially of a terpolymer consisting essentially of monomers selected from the group consisting of
   (i) methacrylic acid,(ii) alkyl methacrylates having 4 to 15 carbons in the alkyl group or methyl methacrylate, and (iii) styrene or acrylonitrile;
   (b) from about 0.1 to about 20 weight percent of a radiation-activatable polymerization initiator; and
   (c) from about 20 to about 80 weight percent of a polymerizable acrylate or methacrylate of a dihydric to tetrahydric alcohol, said polymerizable acrylate or methacrylate comprising from 10 to about 100 weight percent, relative to the total amount of polymerizable compound, of a polypropylene glycol diacrylate or dimethacrylate corresponding to the formula

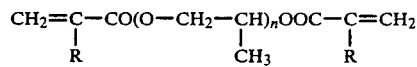

wherein
R represents a hydrogen atom or a methyl group and
n represents a number from 2 to 13.

2. A radiation-polymerizable mixture according to claim 1 wherein R represents a methyl group.

3. A radiation-polymerizable mixture according to claim 1 wherein R represents a hydrogen atom.

4. A radiation-polymerizable mixture according to claim 1 wherein n represents a number from 4 to 10.

5. A radiation-polymerizable mixture according to claim 1 further comprising at least one polymerizable compound selected from the group consisting of acrylic acid esters or methacrylic acid esters of polyhydric alcohols having from 2 to 4 hydroxyl groups.

6. A radiation-polymerizable mixture according to claim 1, consisting essentially of from about 30 to about 70 weight percent of said binder, from about 0.1 to about 20 weight percent of said radiation-activatable polymerization initiator and from about 30 to about 70 weight percent polymerizable compounds.

7. A radiation-polymerizable mixture according to claim 1 wherein said dihydric to tetrahydric alcohol contains urethane groups in the molecule.

8. A radiation-polymerizable mixture according to claim 1 wherein said polymerization initiator is selected from the group consisting of benzoin, benzoin ethers, polynuclear quinones, acridine derivatives, phenazine derivatives, quinoxaline derivatives, and quinazoline derivatives.

9. A radiation-polymerizable mixture according to claim 7, wherein said polymerizable acrylate or methacrylate corresponds to the formula $$\begin{array}{c}
\phantom{CH_2=}R\\
\phantom{CH_2=}|\\
CH_2=C-CO-O-CH_2\\
\phantom{CH_2=C-CO-O-C}|\\
\phantom{CH_2=C-CO-O}CH-O-[CONH-X-NHCO-O-Y-]_n-CONH-X-NHCO-O-CH\\
\phantom{CH_2=C-CO-O-C}|\\
CH_2=C-CO-O-CH_2\\
\phantom{CH_2=}|\\
\phantom{CH_2=}R'
\end{array} \qquad
\begin{array}{c}
\phantom{CH_2-OOC-}R\\
\phantom{CH_2-OOC-}|\\
CH_2-OOC-C=CH_2\\
|\\
CH_2-OOC-C=CH_2\\
\phantom{CH_2-OOC-}|\\
\phantom{CH_2-OOC-}R'
\end{array} \quad (II)$$

wherein X represents a hydrocarbon radical, preferably a saturated aliphatic or cycloaliphatic radical, having 2 to 20 carbon atoms, Y represents one of the groups:

$(-C_pH_{2p}-S)_{m-1}-C_pH_{2p}-O-;$ $(-C_pH_{2p}-O)_m-;$ $-C_rH_{2r-2}-O-;$ $-C_sH_{2s}-Z(-CO-C_qH_{2q}-O)_m-;$ $(-C_qH_{2q}-O-CO-Q-COO)_m-C_qH_{2q}-O-;$ and $(-C_pH_{2p}-O)_n-\phantom{X}\!\!\!\langle\!\!\bigcirc\!\!\rangle\!\!-R''-\!\!\langle\!\!\bigcirc\!\!\rangle\!\!-O-(C_pH_{2p}-O-)_{n'}$ R and R' individually represent hydrogen atoms or methyl groups, R" represents O, S, $CR_2$ or $SO_2$; Q represents a phenyl group or one of the groups $C_qH_{2q}$ and $C_qH_{2q-2}$; z represents O or NR, n represents a number from 0 to 20; m represents a number from 1 to 40, p represents a number from 2 to 20; q represents a number from 2 to 10; r represents a number from 4 to 20, and s represents a number from 2 to 10.

10. A radiation-polymerizable mixture according to claim 9, wherein R and R' are methyl groups and the value of n ranges from 0 to 20.

11. A radiation-polymerizable mixture according to claim 9, wherein Y represents the group $(-C_pH_{2p}-O-)_m-$ and the value of p ranges from 2 to 10.

12. A copying material comprising a support and a radiation-polymerizable layer consisting essentially of:
(a) from about 20 to about 80 weight percent of a binder which is insoluble in water, but soluble or at least swellable in aqueous alkaline solutions, and which consists essentially of a terpolymer consisting essentially of monomers selected from the group consisting of (i) methacrylic acid, (ii) alkyl methacrylates having 4 to 15 carbons in the alkyl group or methyl methacrylate, and (iii) styrene or acrylonitrile;
(b) from about 0.1 to about 20 weight percent of a radiation-activatable polymerization initiator; and
(c) from about 20 to about 80 weight percent of a polymerizable acrylate or methacrylate of a dihydric to tetrahydric alcohol, said polymerizable acrylate or methacrylate comprising from 10 to 100 weight percent, relative to the total amount of polymerizable compound, of a polypropylene glycol diacrylate or dimethacrylate corresponding to the formula $$CH_2=C-CO(O-CH_2-CH)_nOOC-C=CH_2$$
$$\phantom{CH_2=}|\phantom{CO(O-CH_2-CH)_nOOC-}|\phantom{C=CH}|$$
$$\phantom{CH_2=}R\phantom{CO(O-CH_2-)}CH_3\phantom{OOC-C=}R$$

wherein
R represents a hydrogen atom or methyl group and n represents a number from 2 to 13.

13. A copying material according to claim 12 wherein said polymerizable layer has a thickness lying in the range from 0.5 to 150 μm.

14. A copying material according to claim 12 wherein said support is selected from the group consisting of copper, steel, chromium-plated copper, chromium-plated steel, zinc, nickel, aluminum, aluminum alloys, silicon dioxide, doped oxide layers, polyethylene terephthalate films, cellulose acetate films, nylon gauze and nickel screens.

15. A copying material according to claim 12 wherein R represents a methyl group.

16. A copying material according to claim 12 wherein n represents a number from 4 to 10.

17. A copying material according to claim 12 wherein said dihydric to tetrahydric alcohol contains urethane groups in the molecule.

18. A copying material according to claim 17, wherein said polymerizable acrylate or methacrylate corresponds to the formula $$\begin{array}{c}
\phantom{CH_2=}R\\
\phantom{CH_2=}|\\
CH_2=C-CO-O-CH_2\\
\phantom{CH_2=C-CO-O-C}|\\
\phantom{CH_2=C-CO-O}CH-O-[CONH-X-NHCO-O-Y-]_n-CONH-X-NHCO-O-CH\\
\phantom{CH_2=C-CO-O-C}|\\
CH_2=C-CO-O-CH_2\\
\phantom{CH_2=}|\\
\phantom{CH_2=}R'
\end{array} \qquad
\begin{array}{c}
\phantom{CH_2-OOC-}R\\
\phantom{CH_2-OOC-}|\\
CH_2-OOC-C=CH_2\\
|\\
CH_2-OOC-C=CH_2\\
\phantom{CH_2-OOC-}|\\
\phantom{CH_2-OOC-}R'
\end{array} \quad (II)$$

wherein X represents a hydrocarbon radical, preferably a saturated aliphatic or cycloaliphatic radical, having 2 to 20 carbon atoms, Y represents one of the groups:

$(-C_pH_{2p}-S)_{m-1}-C_pH_{2p}-O-;$ $(-C_pH_{2p}-O)_m-;$ $-C_rH_{2r-2}-O-;$ $-C_sH_{2s}-Z(-CO-C_qH_{2q}-O)_m-;$ $(-C_qH_{2q}-O-CO-Q-COO)_m-C_qH_{2q}-O-;$ and

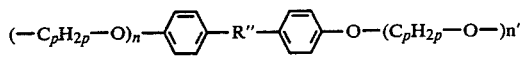

R and R' individually represent hydrogen atoms or methyl groups, R" represents O,S,CR$_2$ or SO$_2$; Q represents a phenyl group or one of the groups C$_q$H$_{2q}$ and C$_q$H$_{2q-2}$; Z represents O or NR, n represents a number from 0 to 20; m represents a number from 1 to 40, p represents a number from 2 to 20; q represents a number from 2 to 10; r represents a number from 4 to 20, and s represents a number from 2 to 10.

19. A copying material according to claim 18, wherein R and R' are methyl groups and the value of n ranges from 0 to 20.

20. A copying material according to claim 18, wherein Y represents the group (—C$_p$H$_{2p}$—O)$_m$— and the value of p ranges from 2 to 10.

* * * * *